United States Patent [19]

Schindler

[11] Patent Number: 4,902,239

[45] Date of Patent: Feb. 20, 1990

[54] ROTATABLE MANIPULATOR FOR A PLUG BOARD

[75] Inventor: Walter A. Schindler, Benglen, Switzerland

[73] Assignee: Elma Electronic AG, Wetzikon, Switzerland

[21] Appl. No.: 204,075

[22] Filed: Jun. 8, 1988

[30] Foreign Application Priority Data

Sep. 1, 1987 [CH] Switzerland ............... 3345/87

[51] Int. Cl.$^4$ .............................................. H01R 13/62
[52] U.S. Cl. ........................................ 439/153; 439/157
[58] Field of Search ..................... 439/152–160, 439/476, 483, 372

[56] References Cited

U.S. PATENT DOCUMENTS

| T876,004 | 7/1870 | Andreini et al. | 439/157 |
| 4,183,602 | 1/1980 | Meunier et al. | 439/157 |
| 4,233,646 | 11/1980 | Leung et al. | 361/399 |
| 4,243,283 | 1/1981 | Sparran | 439/157 |
| 4,602,835 | 7/1986 | Bauer et al. | 439/160 |
| 4,648,009 | 3/1987 | Beun et al. | 439/160 |
| 4,699,594 | 10/1987 | Assel et al. | 439/152 |

FOREIGN PATENT DOCUMENTS 0097228 4/1983 European Pat. Off. .
0191968 8/1986 European Pat. Off. .

*Primary Examiner*—David Pirlot
*Attorney, Agent, or Firm*—Kenyon & Kenyon

[57] ABSTRACT

The manipulator for pushing plug connectors of a plug board out of engagement with spring strips of a component support has a lug for engaging a plug-in surface of the support in order to engage the plug connectors with the spring strips. The same manipulator is used not only for unplugging the connectors but also for establishing a connection between the plug connectors and the spring strips.

6 Claims, 2 Drawing Sheets

ROTATABLE MANIPULATOR FOR A PLUG BOARD

This invention relates to rotatable manipulator for a plug board.

As is known, various types of devices have been utilized for the plugging-in of plug connectors of a plug board. For example, European Patent Application No. 191968 describes the use of a manipulator which, upon actuation, causes the release of a plug connector of a plug board from a spring strip mounted within a suitable cabinet or support However, such a manipulator cannot establish a plug connection between the plug connector and the spring strip Accordingly, it is an object of the invention to provide a manipulator which is capable of not only disconnecting a plug connector from a spring strip but also engaging the plug connector with the spring strip.

It is another object of the invention to simplify the pushing out and plugging in of multi-pole plug connectors of plug boards Briefly, the invention is directed to a support or cabinet which has at least one spring strip mounted therein and at least one plug board which is slidably mounted in the support with at least one plug connector for slidably engaging with the spring strip. In accordance with the invention, at least one manipulator is pivotally mounted on the plug board to provide for disengaging of the plug connector from the spring strip as well as engagement of the plug connector with the spring strip. To this end, the manipulator is provided with a first lug for engaging a push-out surface of the support in response to pivoting of the manipulator in one direction in order to cause movement of the plug board away from the spring strip to dis-engage the plug connector from the spring strip. The manipulator also has a second lug for engaging a plug-in surface of the support in response to a counter-pivoting of the manipulator in order to cause movement of the plug board towards the spring strip to engage the plug connector with the spring strip.

A front plate may also be secured to the plug board on a side opposite the plug connector. In this case, a slot-like recess is provided in the plate for passage of the manipulator therethrough. When the manipulator is in a normal position corresponding to the plug connector being in engagement with the spring strip, the manipulator covers this recess.

When the manipulator is pivoted in order to engage the plug connector with the spring strip, the lug for this purpose contacts the plug-in surface of the support and exerts a force perpendicular to the front plate. For example, where the front plate is vertical, the force is a horizontal force. The plug board is then guided, for example by guide holders within the support rearwardly into the support and towards the spring strip in order to establish a connection therebetween.

The support may include a longitudinal section which is common to a plurality of plug boards. In this case, the longitudinal section has both the push-out surface and the plug-in surface thereon.

The pivoting range of the manipulator may be limited in the plug-in direction by means of a recess in the manipulator which receives the front plate. This limiting of the pivoting range, in turn, limits the movement of the plug board in the plug-in direction which is caused by the manipulator.

These and other objects and advantages of the invention will become more apparent from the following description taken in conjunction with the accompanying drawings wherein:

FIG. 1 schematically illustrates a support and plug board arrangement constructed in accordance with the invention;

Figure 1:
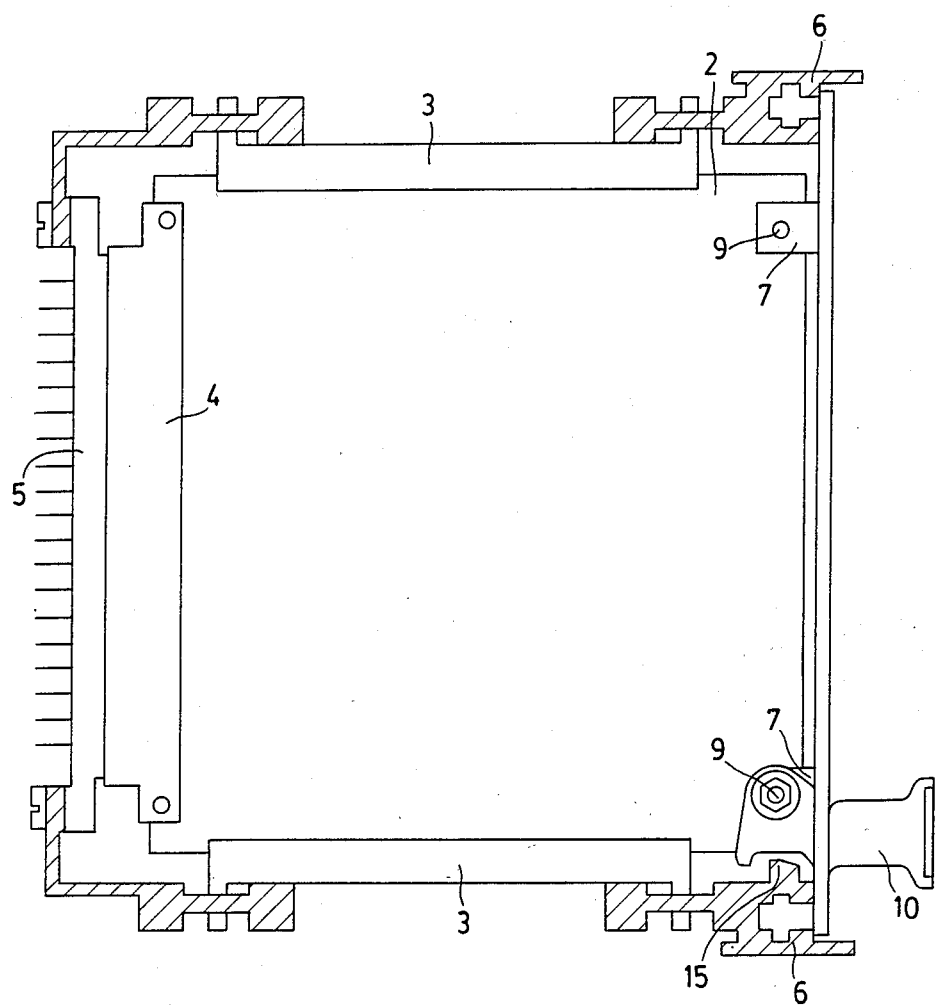

Referring to FIG. 1, the plug board 1 includes at least one circuit board 2 slidably mounted within a pair of guide holders 3 of a component support or Cabinet (not shown). In addition, each circuit board 2 has a plurality of plug connectors 4 at a rearmost end for slidably engaging with respective spring strips 5 mounted within the support (not shown). As indicated, the support includes a pair of longitudinal sections 6 for purposes as described below.

Each circuit board 2 is provided at the front end opposite the plug connectors 4 with two pairs of holding brackets 7 to which a vertically disposed front plate 8 is secured by suitable means (not shown). In addition, each pair of holding brackets 7 is connected by a pin 9 to the circuit board 2. As illustrated, with the board 2 vertically disposed, the plate 8 extends transversely of the board 2 and the brackets 7 so as to extend beyond the plug board 2 and the brackets 7. That is, the height of the plate 8 is greater that the height of the board 2.

Figure 2A:
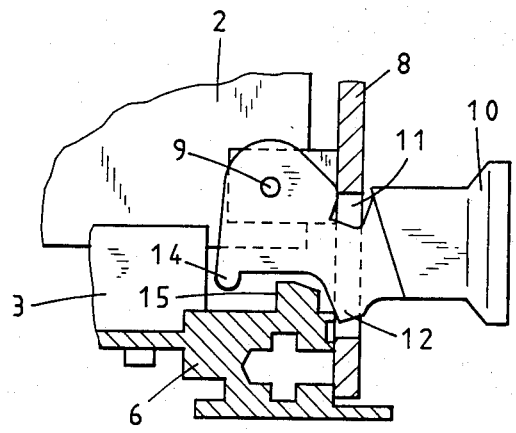
FIG. 2a illustrates a view of a manipulator in a normal position in accordance with the invention.

Referring to FIG. 2a, a manipulator 10 is pivotally mounted on each pin 9 within the vertical extent of the board 2 and passes through a slot-like recess 11 in the plate 8. Each manipulator 10 has a lug 12 on the underside, as viewed, for engaging a push-out surface 13 on a longitudinal section 6 of the support (not shown). In the normal position of the manipulator 10, the lug 12 abuts the push-out surface 13 on the longitudinal section 6. This position corresponds to the front plate 8 abutting the longitudinal section 6 as well as an engagement of the plug connectors 4 with the spring strips 5 (see FIG. 1).

Figure 2B:
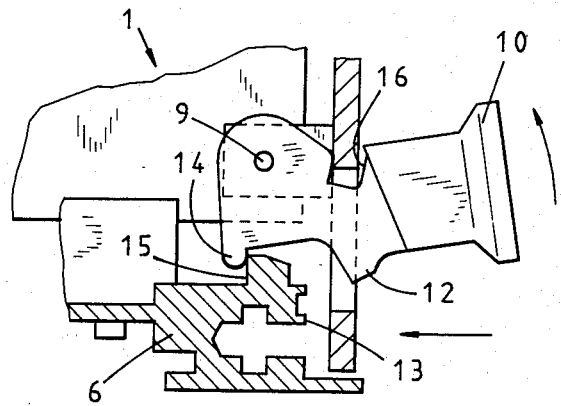
FIG. 2b illustrates the manipulator of FIG. 2a in an initial stage for a plug-in movement.
Figure 2C:
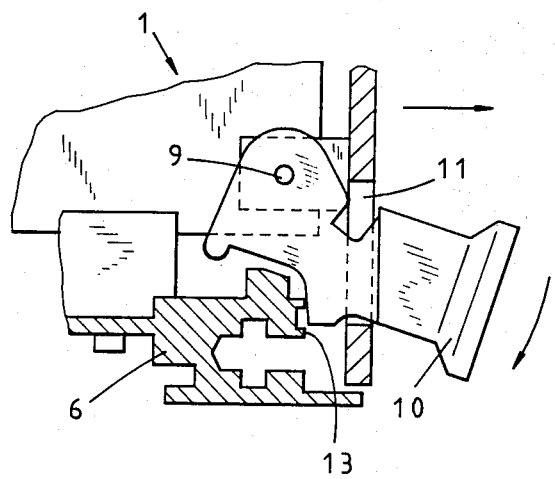
FIG. 2c illustrates a view of the manipulator at the completion of a pushing-out phase.

In order to disengage the plug connectors 4 from the spring strips 5, the manipulator is pivoted downwardly, that is, clockwise as indicated in FIG. 2c. This causes the lug 12 to push against the push-out surface 13 on the longitudinal section 6 thereby causing the plug board 1 together with the plate 8 to move in the direction indicated by the arrow, that is, to the right as viewed in FIG. 2c. In this manner, the plug connection between the plug connectors 4 and the spring strips 5 is disengaged.

Referring to FIG. 2a, each manipulator 10 also has a second lug 14 for engaging a plug-in surface 15 on the longitudinal section 6 of the support in response to a counter-pivoting of the manipulator 10, that is, a counterclockwise pivoting as indicated in FIG. 2b.

Referring to FIG. 2b, during the counter-clockwise pivoting of the manipulator, the lug 14 engages the plug-in surface 15 and causes a displacement of the plug board 1 to the left relative to the longitudinal section so that a plug connection is established between the plug connectors 4 and spring strips 5.

As indicated in FIG. 2a, the lug 14 is positioned at a radially shorter distance from the pin 9 than the lug 12. Also, the plug-in surface 15 and the push-out surface 13 are formed on the longitudinal section 6. Alternatively, the plug-in surface 15 may be formed on a stop which is separately fastened to the longitudinal section 6.

Each manipulator 10 is also provided with a recess 16 as indicated in FIG. 2b. When in the normal position as indicated in FIG. 2a, that is, the locked state, the manipulator 10 covers the recess 11 in the plate 8.

The limitation of the movement of the plug board 1 in the plug-in direction is achieved by the abutment of the front plate 8 against the longitudinal section 6 (see FIG. 2a) or the abutment of the plug connectors 4 on the spring strips 5.

The invention thus provides a rotatable manipulator which can be used for the pushing out and plugging in of multi-pole plug connectors of plug boards inserted within guide holders of a component support.

Further, the invention provides a rotatable manipulator of relatively simple construction.

What is claimed is:

1. In combination
    a support;
    at least one spring strip mounted in said support;
    at least one vertically disposed plug board slidably mounted in said support and having at least one plug connector for slidably engaging with said spring strip;
    a front plate secured to said plug board on a side opposite said plug connector to extend vertically above and below said board and having at least one slot-like recess at one end of said plate; and
    at least one manipulator pivotally mounted on said plug board at a predetermined location within the vertical extend of said board and extending through said recess of said plate, said manipulator having a first lug for engaging a push-out surface of said support in response to pivoting of said manipulator in one direction to cause movement of said plug board away from said spring strip to disengage said plug connector from said spring strip, said manipulator having a second lug for engaging a plug-in surface of said support in response to a counter-pivoting of said manipulator to cause movement of said plug board towards said spring strip to engage said plug connector with said spring strip.

2. The combination as set forth in claim 1 wherein said support has a longitudinal section common to a plurality of said plug boards, said longitudinal section having said push-out surface and said plug-in surface thereon.

3. The combination as set forth in claim 1 wherein said manipulator covers said recess in a normal position thereof corresponding to said plug connector engaging with said spring strip.

4. The combination as set forth in claim 1 which further comprises a pair of brackets secured to and between said plug board and said plate on one of said brackets.

5. The combination as set forth in claim 4 wherein each bracket is secured to and projects vertically from a respective corner of said board.

6. In combination
    a vertically disposed plug board having at least one plug connector at a rear end;
    a pair of brackets secured at opposite corners of said plug board at a front end thereof;
    a vertically disposed plate secured to said brackets and extending vertically above and below said plug board and said brackets; and
    a manipulator pivotally mounted on at least one of said brackets at a predetermined location within the vertical extend of said board and extending through said plate, said manipulator having a first lug for engaging a push-out surface of a support in response to pivoting of said manipulator in one direction and a second lug for engaging a plug-in surface of the support in response to a counter-pivoting of said manipulator.

* * * * *

UNITED STATES PATENT AND TRADEMARK OFFICE
CERTIFICATE OF CORRECTION

PATENT NO. : 4,902,239

DATED : February 20, 1990

INVENTOR(S) : Walter A. Schindler

It is certified that error appears in the above-identified patent and that said Letters Patent is hereby corrected as shown below:

```
Column 1, line 13  "support However" should be -support.  However-
Column 1, line 15  "strip" should be -strip.-
Column 1, line 22  "boards" should be -boards.-
Column 2, line 16  "Cabinet" should be -cabinet- Column 2, line 32  "that" should be -than-
Column 3, line 33  "extend" should be -extent-
Column 4, line 33  "extend" should be -extent-
```

Signed and Sealed this

Sixteenth Day of July, 1991

Attest:

HARRY F. MANBECK, JR.

*Attesting Officer*  *Commissioner of Patents and Trademarks*